(12) United States Patent
Itoh et al.

(10) Patent No.: US 8,029,179 B2
(45) Date of Patent: Oct. 4, 2011

(54) PLANAR ILLUMINATION APPARATUS AND LIQUID CRYSTAL DISPLAY APPARATUS USING THE SAME

(75) Inventors: Tatsuo Itoh, Osaka (JP); Takayuki Nagata, Osaka (JP); Tetsuro Mizushima, Osaka (JP); Kazuhisa Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 428 days.

(21) Appl. No.: 12/443,881

(22) PCT Filed: Sep. 25, 2007

(86) PCT No.: PCT/JP2007/068568
§ 371 (c)(1),
(2), (4) Date: Apr. 1, 2009

(87) PCT Pub. No.: WO2008/041559
PCT Pub. Date: Apr. 10, 2008

(65) Prior Publication Data
US 2010/0045894 A1 Feb. 25, 2010

(30) Foreign Application Priority Data
Oct. 2, 2006 (JP) ................. 2006-270385

(51) Int. Cl.
*F21V 7/04* (2006.01)
*G02F 1/1335* (2006.01)
(52) U.S. Cl. ........ 362/608; 362/610; 362/259; 362/609; 362/561; 362/611; 349/61; 349/62; 349/65

(58) Field of Classification Search .......... 362/608–611, 362/613, 621, 628, 268, 259, 559–561; 349/61, 349/62, 65; 359/599
See application file for complete search history.

(56) References Cited

U.S. PATENT DOCUMENTS

| | | | |
|---|---|---|---|
| 6,334,691 B1 * | 1/2002 | Suzuki et al. | 362/608 |
| 7,859,610 B2 * | 12/2010 | Mizushima et al. | 349/61 |
| 7,918,600 B2 * | 4/2011 | Nagata et al. | 362/616 |
| 2008/0055515 A1 * | 3/2008 | Ha et al. | 349/61 |
| 2009/0190070 A1 * | 7/2009 | Nagata et al. | 349/65 |
| 2010/0220261 A1 * | 9/2010 | Mizushima et al. | 349/64 |

FOREIGN PATENT DOCUMENTS

| | | |
|---|---|---|
| JP | 9-307174 | 11/1997 |
| JP | 11-271767 | 10/1999 |
| JP | 2005-332719 | 12/2005 |
| JP | 2006-73202 | 3/2006 |

OTHER PUBLICATIONS

International Search Report issued Oct. 30, 2007 in the International (PCT) Application No. PCT/JP2007/068568.

* cited by examiner

*Primary Examiner* — Bao Q Truong
(74) *Attorney, Agent, or Firm* — Wenderoth, Lind & Ponack, L.L.P.

(57) ABSTRACT

Laser lights emitted from a light source 30 are diffused in a direction parallel to main surfaces of a light guide plate 9 by a one-dimensional diffuser 5. The diffused laser lights are converted to parallel lights by a first cylindrical lens 6, and are then converged in a direction of the thickness of the light guide plate 9 by a second cylindrical lens 7. The converged laser lights are reflected 90 degrees twice by a mirror 8, and are guided to a side surface of the light guide plate 9.

25 Claims, 18 Drawing Sheets

FIG. 4
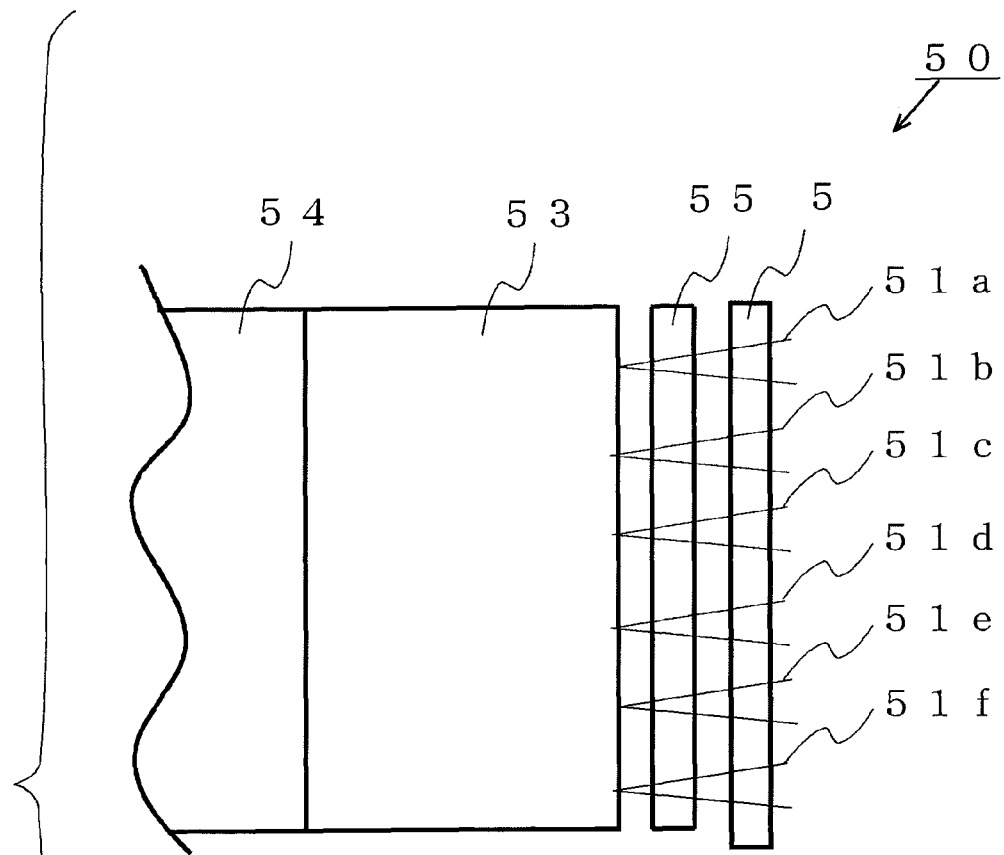
(a)
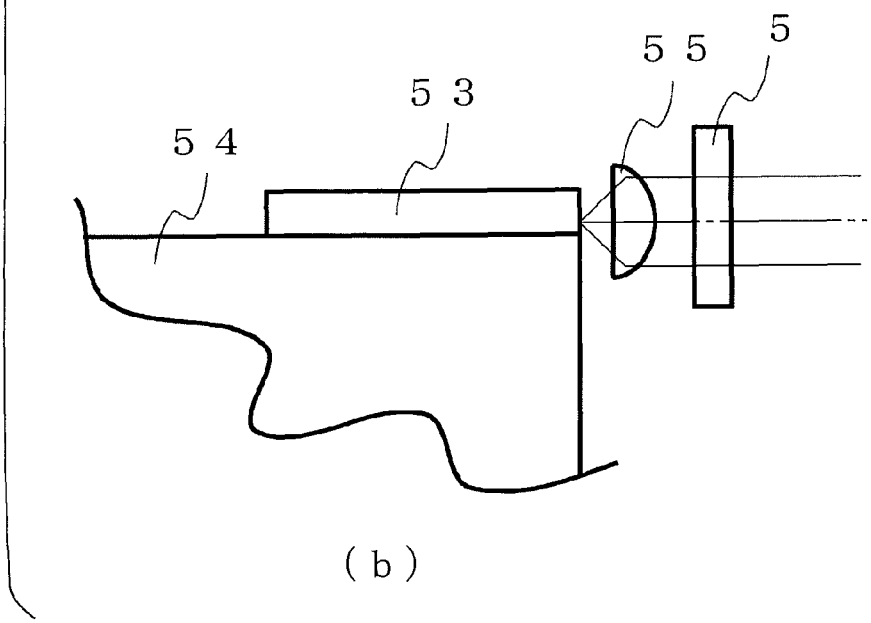
(b)

ONE-DIMENSIONAL DIFFUSER
(DOUBLE-SIDE LENTICULAR LENS)

CYLINDRICAL FRESNEL LENS

F I G. 1 8    PRIOR ART
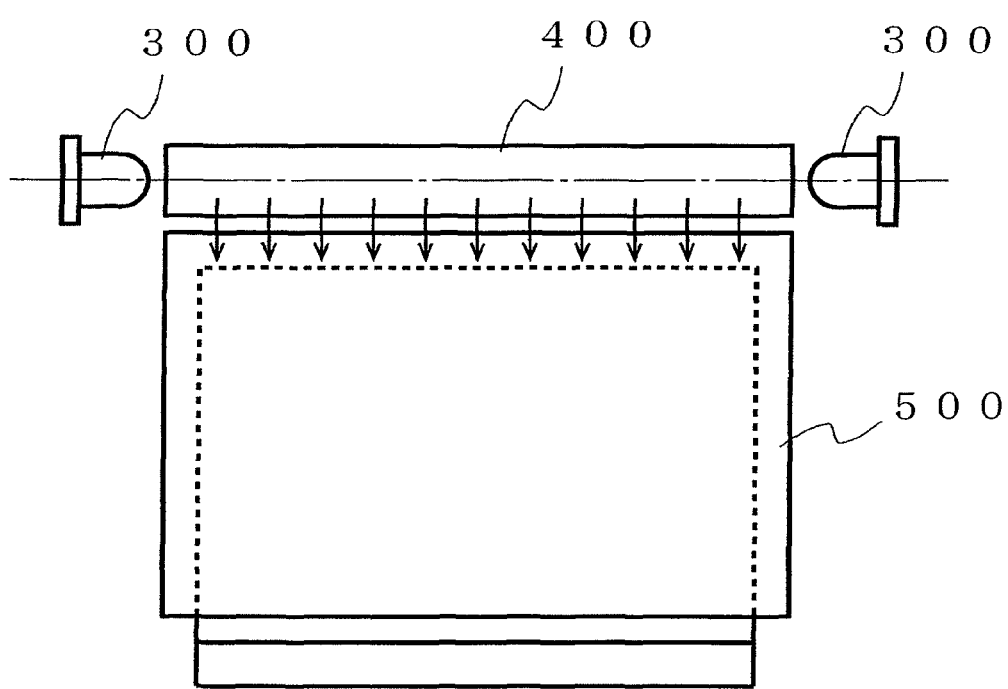

PLANAR ILLUMINATION APPARATUS AND LIQUID CRYSTAL DISPLAY APPARATUS USING THE SAME

TECHNICAL FIELD

The present invention relates to a planar illumination apparatus which has a reduced thickness and uses a laser element as a light source, and a liquid crystal display apparatus using the planer illumination apparatus.

BACKGROUND ART

Conventionally, a backlight illumination using a cold cathode fluorescent tube is widely used for a liquid crystal display apparatus using a liquid crystal display panel. Further, in recent years, a backlight illumination using light emitting diodes (LED elements) of three colors, which emit red, green, and blue lights, respectively, has been developed so as to reproduce natural color tone with enhanced brightness.

In particular, for a relatively small-scale backlight illumination used when an enhanced brightness is unnecessary, a lateral light source type planar illumination apparatus of a so-called edge light type is used in which a light from a light source is incident on a side surface (incidence plane) of a light guide plate, and the light is emitted from one main surface (emission surface) of the light guide plate so as to perform illumination. On the other hand, for a large-scale backlight illumination used when a high brightness is needed, a direct illumination apparatus having cathode fluorescent tubes or LED elements arranged in a planar form is used.

In the future, a demand for a liquid crystal display apparatus which has a thin large screen used for, for example, a wall-hanging television may be increased. However, reduction in thickness of the direct illumination apparatus is more difficult than reduction in thickness of the edge light type illumination apparatus. On the other hand, the edge light type illumination apparatus having an increased screen size may not ensure a sufficient brightness.

In order to realize a liquid crystal display apparatus having a thin and large screen, a study for an edge light type planar illumination apparatus using, as a light source, LED elements each having a brightness enhanced has commenced. For example, a type disclosed in Patent Document 1 has been suggested.

In a case where LED elements are used as a light source for the edge light type illumination apparatus, when a plurality of LED elements are arranged in line on a side surface of a light guide plate, power consumption may be increased and/or generation of heat may be increased. Therefore, it is disclosed in Patent Document 1 that, as shown in FIG. 18, a bar-type light guide element 400 is disposed adjacent to the side surface of a light guide plate 500, and two LED elements 300 are disposed on both ends of the bar-type light guide element 400. In this configuration, lights from the two LED elements 300 are subjected to multiple reflection in the bar-type light guide element 400, so as to obtain a uniform light amount distribution, and are then incident on the side surface of the light guide plate 500 from the side surface of the bar-type light guide element 400 after the uniform light a mount distribution is obtained.

Patent Document 1: Japanese Laid-Open Patent Publication No. 11-271767

DISCLOSURE OF THE INVENTION

Problems to be Solved by the Invention

A laser element is used as an element which can enhance a brightness as compared to a LED element. Therefore, it is suggested that the laser element is used as a light source, instead of the LED element, in the configuration disclosed in Patent Document 1. However, the following problem newly arises.

Initially, unlike the LED element which is a point light source for emitting a light from one point, when a laser element which is a parallel light source for emitting parallel lights is used, the reflection of the lights is reduced in the bar-type light guide element, and therefore a linear light source for performing uniform emission is not realized.

Further, to be specific, a semiconductor laser which is a divergence light source has a light emission angle different from the LED element, and represents an anisotropy in an active layer. Therefore, even when semiconductor lasers are simply mounted on the end portions of the bar-type light guide element, a linear light source for performing uniform emission is not realized.

Therefore, an object of the present invention is to provide a planar illumination apparatus which has a reduced thickness and an increased area size and uses laser elements as a light source, and a liquid crystal display apparatus using the planer illumination apparatus.

Solution to the Problems

The present invention is directed to a planar illumination apparatus using a laser light. In order to attain the objects mentioned above, the planar illumination apparatus according to the present invention comprises: a laser light source operable to emit laser lights having equally oriented polarization planes; a one-dimensional diffuser operable to diffuse the laser lights emitted from the laser light source at an angle θ in a one-dimensional direction; a cylindrical lens section operable to convert, to parallel lights, the laser lights diffused by the one-dimensional diffuser; and a light guide plate, having a rectangular parallelepiped shape having two main surfaces and four side surfaces, operable to receive the laser lights which are the parallel lights obtained through conversion performed by the cylindrical lens section, on one of the four side surfaces such that the one-dimensional direction is parallel to the two main surfaces, and operable to emit the laser lights from one of the two main surfaces.

It is preferable that the cylindrical lens section further converges the laser lights diffused by the one-dimensional diffuser, in a direction of a thickness of the light guide plate. Alternatively, it is preferable that the one-dimensional diffuser further converges the laser lights emitted from the laser light source, in a direction orthogonal to the one-dimensional direction in which the laser lights are diffused.

Moreover, a mirror operable to reflect the laser lights emitted from the cylindrical lens section so as to make the laser lights incident on one of the four side surfaces of the light guide plate may be further provided. In this case, the laser light source, the one-dimensional diffuser, and the cylindrical lens section may be mounted on the other of the two main surfaces, and the other of the two main surfaces is opposed to the one of the two main surfaces.

In a case where each of the two main surfaces of the light guide plate has such a size as to satisfy a long side W and a short side H, when the laser lights emitted from the cylindrical lens section are incident on a side surface contacting the long side W among the four side surfaces, the angle θ at which the one-dimensional diffuser diffuses the laser lights is calculated by using an expression "$\theta > \tan^{-1}(W/2H) \times 2$", and when the laser lights emitted from the cylindrical lens section are incident on a side surface contacting the short side H among the four side surfaces, the angle θ at which the one-dimensional diffuser diffuses the laser lights is calculated by using an expression "$\theta > \tan^{-1}(H/2W) \times 2$". Typically, the one-dimensional diffuser is a micro cylindrical lens array.

Further, a vibration section operable to slightly vibrate the one-dimensional diffuser may be further provided, and it is effective that a vibration frequency used by the vibration section is a frequency other than an audio frequency, and a vibration amplitude used by the vibration section is set to an interval between two adjacent bright points of a speckle noise.

Further, it is preferable that the equally oriented polarization planes of the laser lights emitted from the laser light source are parallel or perpendicular to the two main surfaces of the light guide plate. In particular, when the laser light source is a multi-emitter semiconductor laser, it is preferable that a plane on which a plurality of emitters of the multi-emitter semiconductor laser are mounted is optically parallel to the two main surfaces of the light guide plate.

Further, the laser light source may include a plurality of light sources operable to emit laser lights having wavelengths, respectively, different from each other. In this case, the laser lights, having a plurality of the wavelengths, which are emitted from the plurality of light sources, respectively, may be incident on the one-dimensional diffuser so as to have an overall width which is smaller than or equal to a thickness of the light guide plate.

Further, the laser light source described above may include: a plurality of light sources operable to emit a plurality of laser lights having wavelengths, respectively, different from each other; an optical fiber operable to transmit the plurality of laser lights emitted from the plurality of light sources, respectively; and a polarization separation section operable to equally orient polarization planes of the plurality of laser lights emitted from the optical fiber. In this case, the polarization separation section may separate the plurality of laser lights into P polarized lights and S polarized lights, and output, as first output lights, one of the P polarized lights and the S polarized lights, and orient polarization planes of the other thereof such that polarization planes of the first output lights and the polarization planes of the other thereof are equally oriented, and thereafter outputs, as second output lights, the other thereof.

A liquid crystal display apparatus may be configured by combining each of the planar illumination apparatuses described above, with a liquid crystal panel illuminated by the laser lights emitted from the planar illumination apparatus, and an image display circuit operable to drive the liquid crystal panel.

Effect of the Invention

According to the present invention, it is possible to realize a planar illumination apparatus which has a reduced thickness and an increased area size and uses a laser element as a light source, and a liquid crystal display apparatus. Further, laser lights emitted from the laser element have a high color purity and a high light emitting efficiency, thereby realizing an enhanced color reproducibility, uniformity in brightness, and reduced power consumption.

BRIEF DESCRIPTION OF THE DRAWINGS

FIG. 4 is a diagram illustrating in detail an exemplary configuration of a multi-emitter semiconductor laser 50.

FIG. 18 is a perspective view illustrating a configuration of a conventional planar illumination apparatus.

Figure 1:
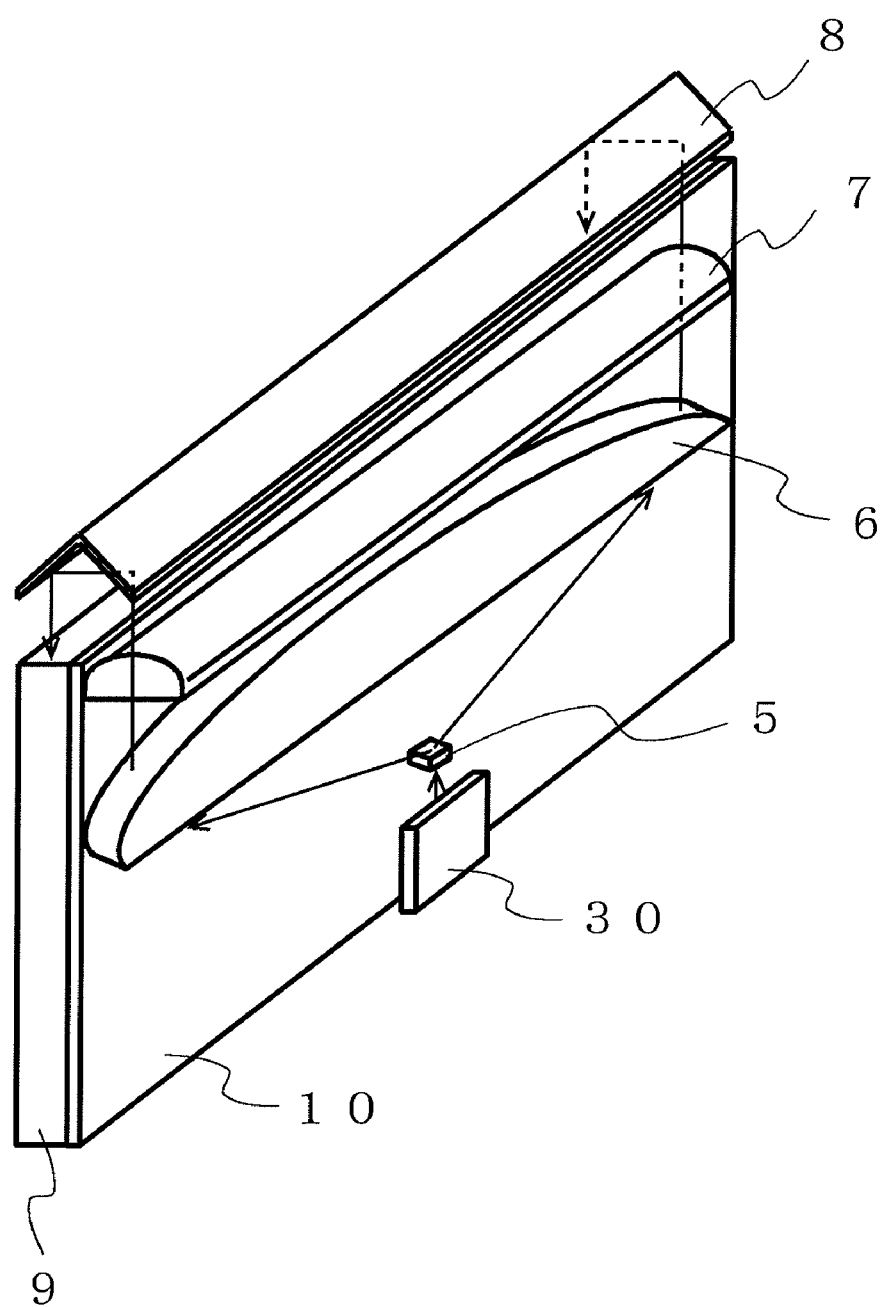
FIG. 1 is a perspective view illustrating a configuration of a planar illumination apparatus according to a first embodiment of the present invention.

DESCRIPTION OF THE REFERENCE CHARACTERS 1, 12 to 14, 30 to 33, 50, 300 light source
2 optical fiber
3 polarization separation section
4a, 4b, 8, 15, 16, 34, 35, 80 mirror
5, 5a, 5b, 40 one-dimensional diffuser
6, 6a, 6b, 7, 7a, 7b, 24, 41, 55 cylindrical lens
9, 500 light guide plate
10 reflector plate
17, 18 lens
19 polarization beam splitter
20 prism
21 half wavelength plate
26, 28 linear actuator
27, 29 guide
42 monitor section
43 connection cable
44 control box
45 planar illumination apparatus
46 liquid crystal panel
47 image display circuit
48 wiring
53 laser chip
54 mount
400 bar-type light guide element

BEST MODE FOR CARRYING OUT THE INVENTION

Hereinafter, embodiments of the present invention will be described with reference to the drawings.

First Embodiment

FIG. 1 is a perspective view illustrating a configuration of a planar illumination apparatus according to a first embodiment of the present invention. The planar illumination apparatus, shown in FIG. 1, according to the first embodiment includes a light source 30, a one-dimensional diffuser 5, a first cylindrical lens 6, a second cylindrical lens 7, a mirror 8, a light guide plate 9, and a reflector plate 10.

The reflector plate 10 is bonded to one main surface of the light guide plate 9. The light source 30, the one-dimensional diffuser 5, the first cylindrical lens 6, and the second cylindrical lens 7 are mounted on the reflector plate 10. A light emitted from the light source 30 passes through the one-dimensional diffuser 5, the first cylindrical lens 6, and the second cylindrical lens 7, and the course of the light is changed 180 degrees by means of the mirror 8, so as to guide the light to the light guide plate 9.

Hereinafter, the respective components of the planar illumination apparatus according to the first embodiment will be sequentially described.

Figure 2:
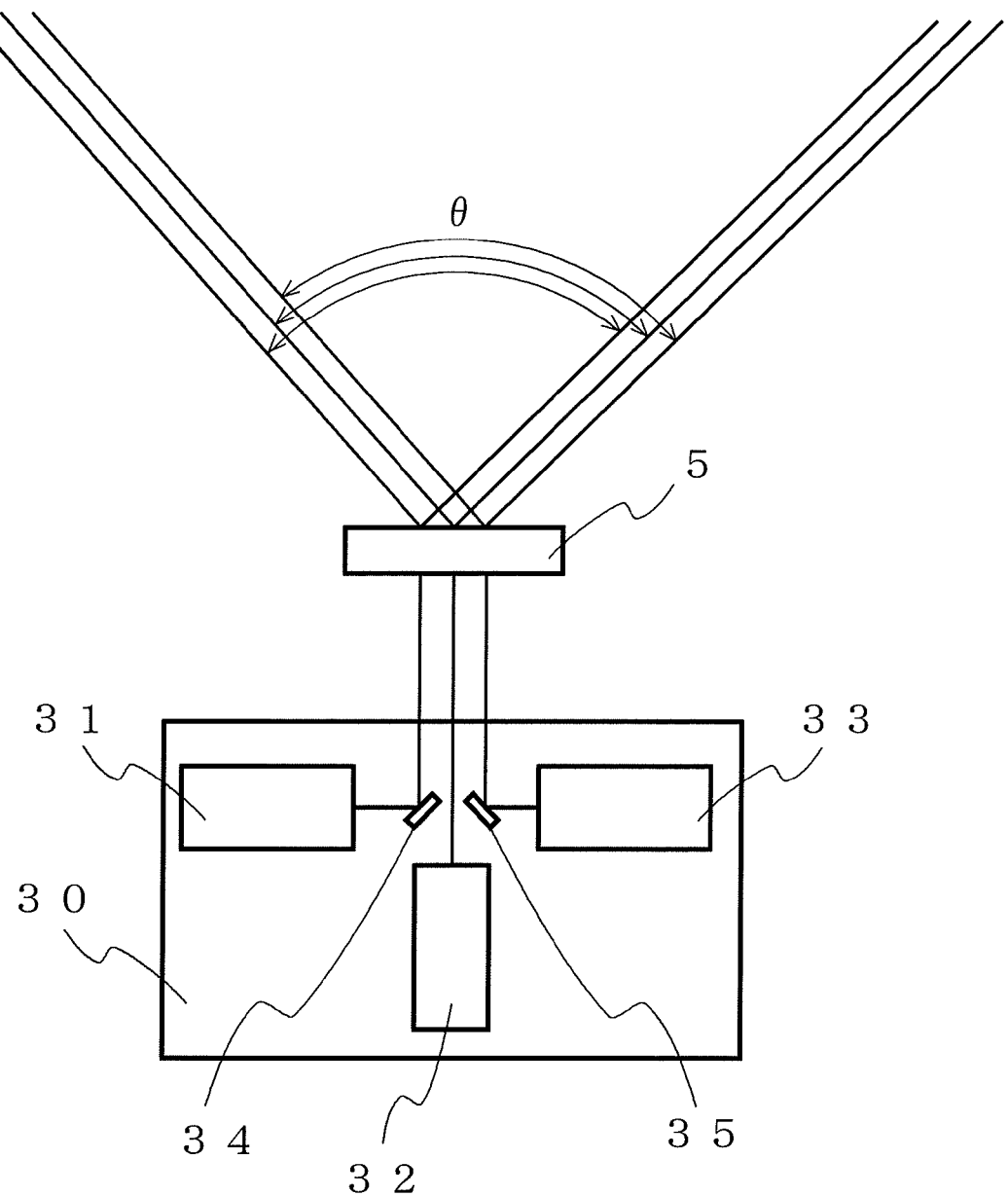
FIG. 2 is a diagram illustrating an exemplary configuration of a light source 30.

The light source 30 is a laser light source which emits laser lights of three primary colors, and has, for example, a configuration as shown in FIG. 2. As shown in FIG. 2, the light source 30 includes a red laser light source 31, a green laser light source 32, a blue laser light source 33, and mirrors 34 and 35. A green laser light emitted from the green laser light source 32 directly enters the one-dimensional diffuser 5. A red laser light emitted from the red laser light source 31 is reflected by the mirror 34 so as to be adjacent and parallel to the green laser light, and enters the one-dimensional diffuser 5. A blue laser light emitted from the blue laser light source 33 is reflected by the mirror 35 so as to be adjacent and parallel to the green laser light, and enters the one-dimensional diffuser 5. All the laser lights emitted from the red laser light source 31, the green laser light source 32, and the blue laser light source 33, respectively, are previously adjusted so as to have the polarization planes equally oriented when the laser lights enter the one-dimensional diffuser 5. The light source 30 may have a configuration, other than the configuration shown in FIG. 2, which enables laser lights of three primary colors to have equally oriented polarization planes when the laser lights enter the one-dimensional diffuser 5.

Figure 3:
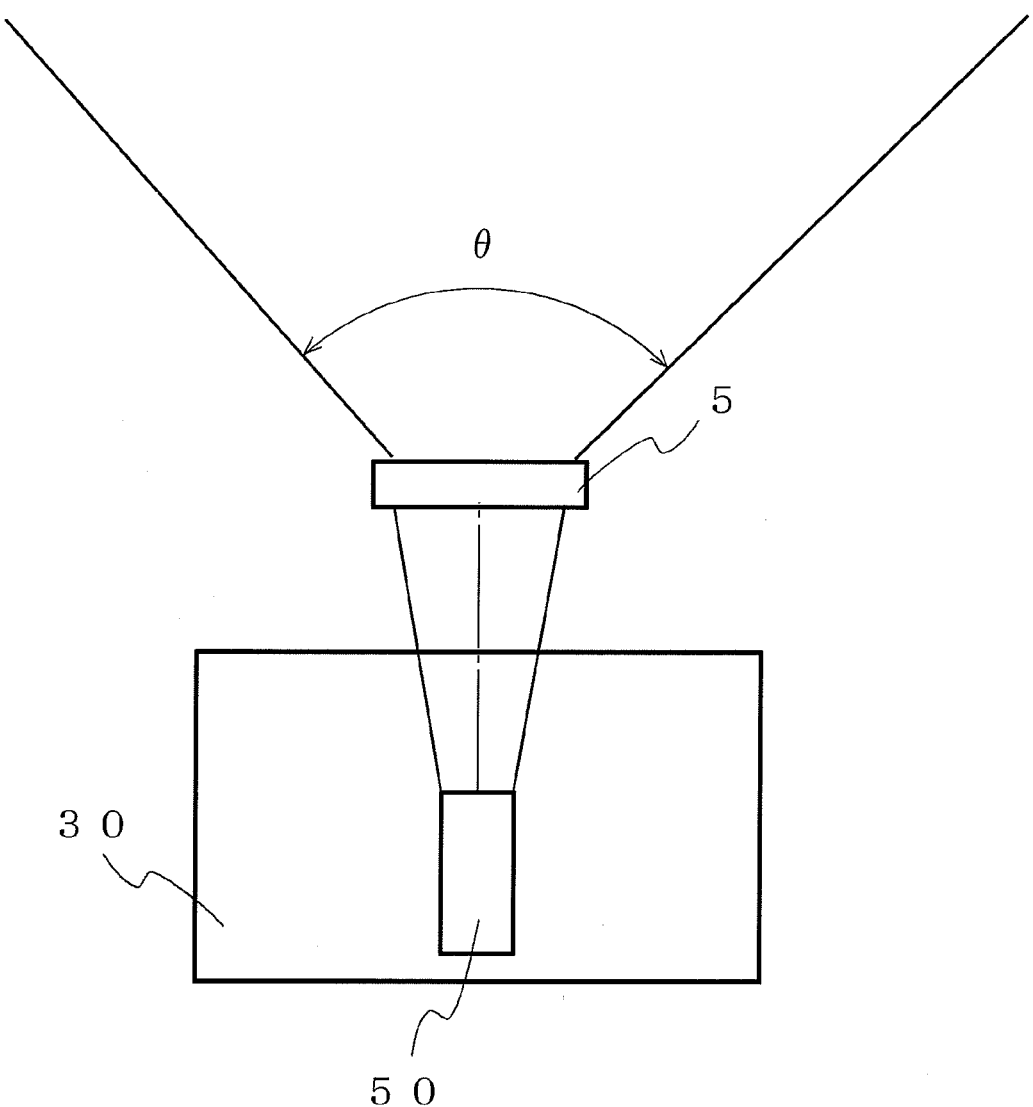
FIG. 3 is a diagram illustrating another exemplary configuration of a light source 30.

Further, FIGS. 3 and 4 show an exemplary configuration in which a multi-emitter semiconductor laser 50 is used as the light source 30. In the multi-emitter semiconductor laser 50, a plurality of light emitting areas are provided in one chip, and enables an output to be enhanced as compared to a single emitter semiconductor laser. As shown in (a) of FIG. 4, a laser chip 53 having the plurality of light emitting areas is bonded to a mount 54. The mount 54 releases heat generated in the laser chip 53, and supplies power to the laser chip 53 in combination with an electrode not shown. A cylindrical lens 55 is a lens for collimating laser lights, for the fast axis direction, emitted from the laser chip 53, and converts, as shown in (b) of FIG. 4, a plurality of laser lights 51a to 51f emitted from the laser chip 53, to parallel lights together having an overall width smaller than or equal to the thickness of the light guide plate 9 in one direction or to lights which are weakly converged on the incidence plane of the light guide plate 9.

When, as indicated in this example, the plurality of light emitting areas of the multi-emitter semiconductor laser 50 are disposed in an area parallel to the main surface of the light guide plate 9, a high output linear light source can be realized by using a few optical elements including the cylindrical lens 55 and the one-dimensional diffuser 5. The main surface of the light guide plate 9 and the light emitting areas of the multi-emitter semiconductor laser 50 may not be physically parallel to each other. When the main surface of the light guide plate 9 and the light emitting areas of the multi-emitter semiconductor laser 50 become optically parallel to each other, for example, by using an image rotation prism, the same effect as obtained in this example may be obtained. Further, a cylindrical lens for collimating the laser lights, for the slow axis direction, emitted from the laser chip 53 may be disposed between the cylindrical lens 55 and the one-dimensional diffuser 5. A typical length of the multi-emitter semiconductor laser 50 is 10 mm for the slow axis direction. Therefore, when the laser lights for the slow axis direction are collimated by a cylindrical lens having, for example, a focal length of 50 mm or more, the angle of view for the slow axis direction may be reduced to NA 0.1. The reduction in the angle of view enables easy designing of the one-dimensional diffuser 5.

The one-dimensional diffuser 5, which is configured as a hologram or a lens array, diffuses the laser lights emitted from the light source 30, at an angel θ, in the one-dimensional direction (see FIGS. 2 and 3). A plane for diffusing the laser lights is designed so as to be parallel to the main surface of the light guide plate 9. The diffused laser lights of three primary colors are almost superimposed on each other in a distant place to become a white laser light.

Figure 5:
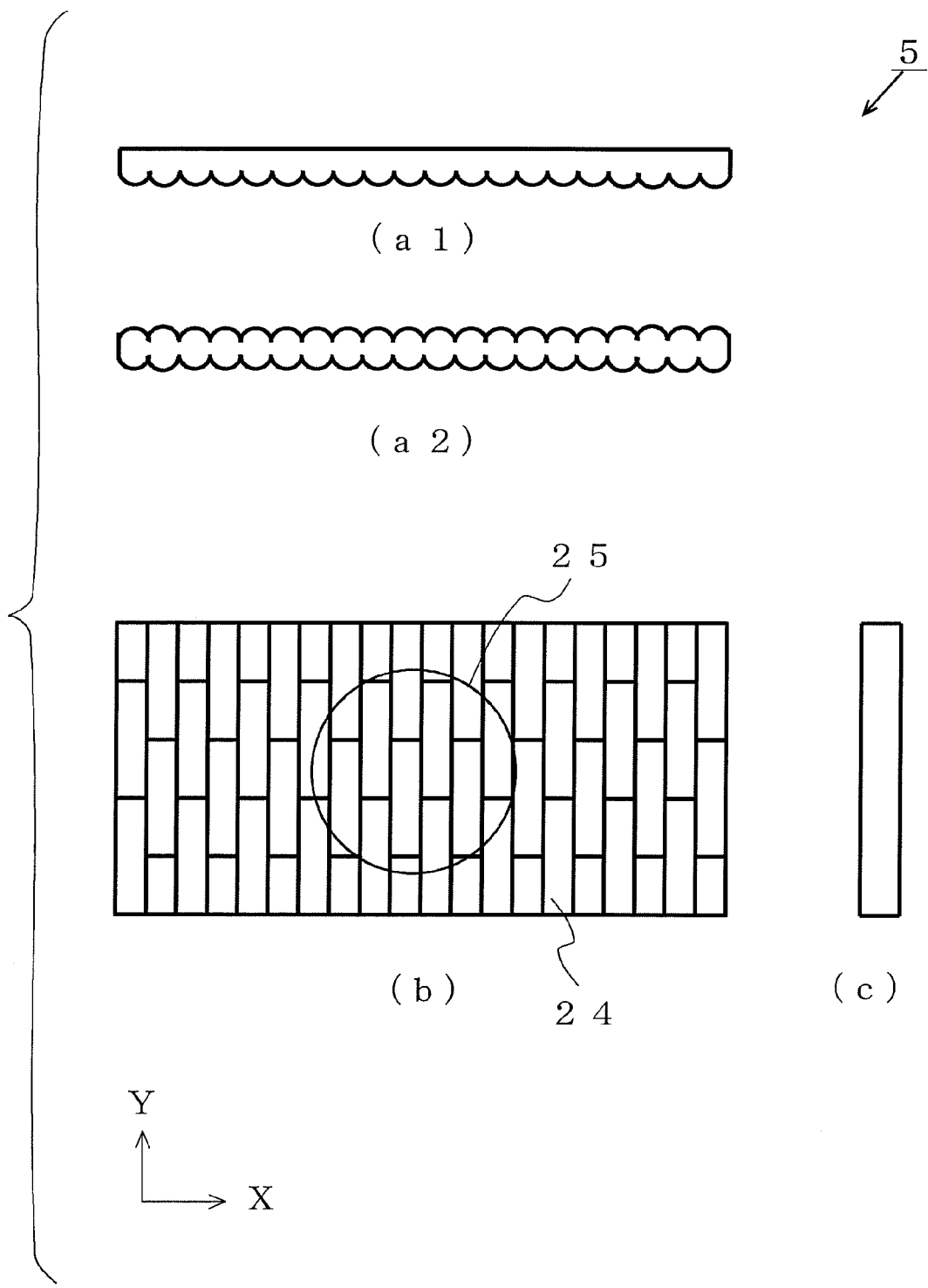
FIG. 5 is a diagram illustrating an exemplary configuration of a one-dimensional diffuser 5.

FIG. 5 includes top views (a1) and (a2), an elevation view (b), and a side view (c) illustrating an exemplary configuration of the one-dimensional diffuser 5. The one-dimensional diffuser 5 shown in FIG. 5 is configured such that a plurality of cylindrical lenses 24 each having a curved surface are aligned on one surface (a1) or both surfaces (a2) in the X-direction shown in the drawing so as to form an array. The laser light 25 incident on the one-dimensional diffuser 5 is separated by the plurality of cylindrical lenses 24, and the separated laser lights are thereafter diffused in the X-direction. The lights diffused from the respective cylindrical lenses 24 are superimposed on each other in a distant place, and the intensities of the lights incident on the cylindrical lenses 24, respectively, are superimposed on each other, thereby obtaining an almost uniform intensity distribution in the distant place. The plurality of cylindrical lenses 24 forming the one-dimensional diffuser 5 may have the same curvature, or may have curvatures which are slightly different from each other. When the curvatures are slightly different from each other, the light amount distribution can vary.

Further, the angle θ at which the one-dimensional diffuser 5 diffuses the laser lights is preferably determined as follows, for example.

For example, the light guide plate 9 has a long side W and a short side H. The light guide plate 9 is preferably designed so as to diffuse the laser lights by using the overall width thereof. Therefore, when, as shown in FIG. 1, the one-dimensional diffuser 5 is mounted at the center of the long side W on the surface of the end portion of the light guide plate 9, the angle θ is calculated by using the following expression [1]. Further, when the one-dimensional diffuser 5 is mounted at the center of the short side H on the surface of the end portion of the light guide plate 9, which is not shown, the angle θ is calculated by using the following expression [2].

$$\theta > \tan^{-1}(W/2H) \times 2 \quad [1]$$

$$\theta > \tan^{-1}(H/2W) \times 2 \quad [2]$$

The first cylindrical lens 6 converts, to parallel lights, the laser lights which have the equally oriented polarization planes and are diffused at the angle θ by the one-dimensional diffuser 5. The second cylindrical lens 7 has a curvature on a surface orthogonal to the first cylindrical lens 6, and converges the laser lights which are the parallel lights obtained through the conversion performed by the first cylindrical lens 6, in the direction of the thickness of the light guide plate 9. The second cylindrical lens 7 enables enhancement of combination efficiency of the lights incident on the light guide plate 9, thereby obtaining a planar illumination apparatus for a bright light. The mirror 8 is a reflector plate having an L-shaped cross section, and reflects the laser lights having been converged in the direction of the thickness of the light guide plate 9 by the second cylindrical lens 7 90 degrees twice, and emits the reflected laser lights to the light guide plate 9. The mirror 8 having the L-shaped cross section enables the optical components for polarizing, separating, diffusing, and converging the laser lights to be disposed on the main surface of the light guide plate 9, thereby enabling reduction in size of the planar illumination apparatus.

The light guide plate 9 has two parallel main surfaces, and four side surfaces perpendicular to the main surfaces, that is, the light guide plate 9 has a rectangular parallelepiped shape. While the laser lights incident on the light guide plate 9 are repeatedly subjected to multiple reflection, or repeatedly diffused in the light guide plate 9, and proceeds, the laser lights are emitted from the main surface of the light guide plate 9. The reflector plate 10 is bonded to one of the main surfaces of the light guide plate 9, and the laser lights are emitted only from the other of the main surfaces thereof, thereby obtaining the planar illumination apparatus providing a uniform high brightness.

Figure 6:
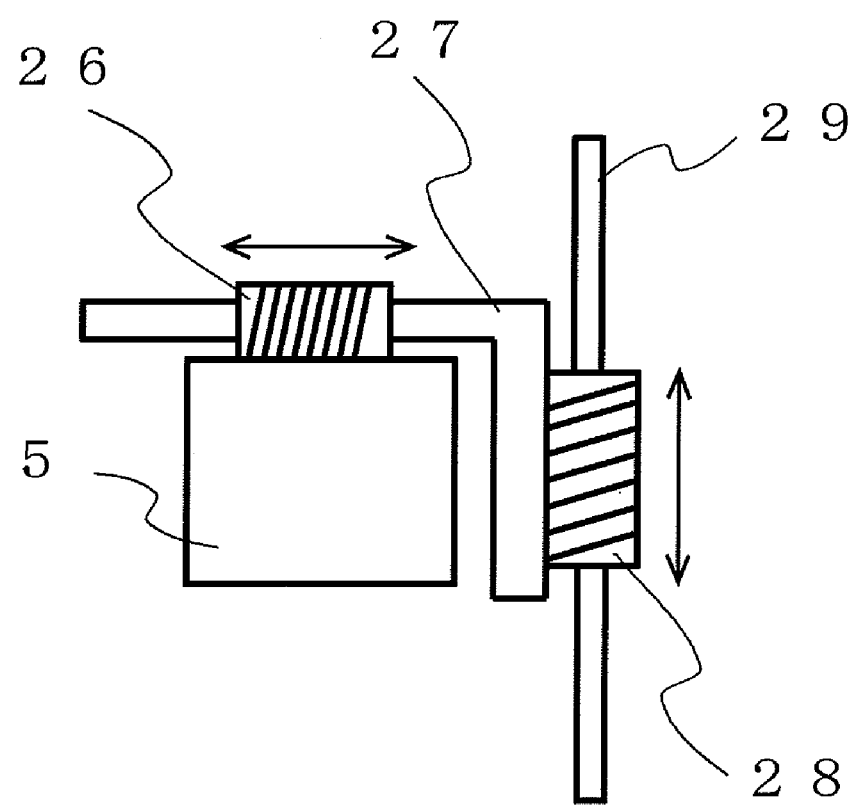
FIG. 6 is a diagram illustrating a driving section for vibrating the one-dimensional diffuser 5.

By using the laser lights, a speckle noise which is a random interference pattern is generated. However, for example, by vibrating the one-dimensional diffuser 5 using a driving section shown in FIG. 6, the interference pattern may be changed. The one-dimensional diffuser 5 is retained by a linear actuator 26. When the linear actuator 26 moves along a guide 27, the one-dimensional diffuser 5 moves in the X direction. The guide 27 is retained by a linear actuator 28. When the liner actuator 28 moves along a guide 29, the one-dimensional diffuser 5 moves in the Y direction shown in the drawing. This configuration enables the one-dimensional diffuser 5 to move in the two directions.

When the one-dimensional diffuser 5 is operated at a vibration frequency of, for example, 10 Hz or more, a person cannot recognize the interference pattern with his/her eyes, and the speckle noise will disappear. Further, when a frequency other than an audio frequency is used as the vibration frequency for the one-dimensional diffuser 5, a vibration sound cannot be heard, so that a noise is cancelled. The vibration amplitude for the one-dimensional diffuser 5 may be shifted such that a bright point of the speckle pattern is superimposed on an adjacent bright point, that is, the vibration amplitude for the one-dimensional diffuser 5 may be shifted over an interval between the adjacent bright points of the speckle noise, or more.

Next, an exemplary specific designing of the planar illumination apparatus according to the first embodiment will be described.

<Fundamental Structure>

Figure 7:
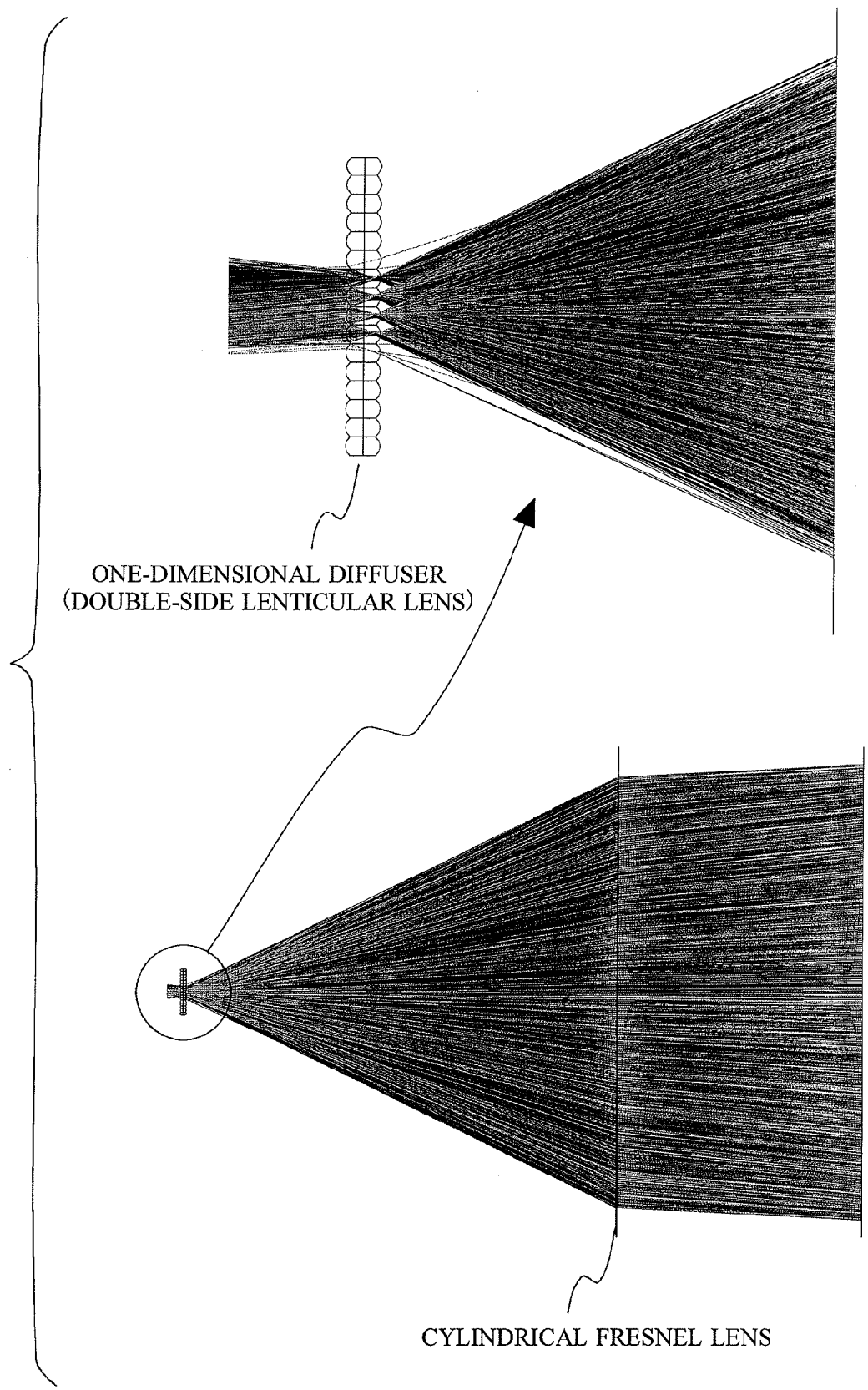
FIG. 7 is a diagram illustrating an exemplary specific designing of the planar illumination apparatus.

FIG. 7 is a diagram illustrating a line diffuser which is a fundamental component of an optical system. A bar laser diode (wavelength 642 nm, output 4 W) for a multi-emitter is used as a laser light source so as to enhance an output. Lights emitted from the laser light source are collimated for the X-Z axis and for the Y-Z axis by an FAC (Fast Axis Collimator) lens and an SAC (Slow Axis Collimator) lens, respectively. The collimated lights are separated by the one-dimensional diffuser (double-sided lenticular lens), and the separated lights are superimposed on each other. Thereafter, the superimposed lights become almost parallel lights by means of a cylindrical Fresnel lens, and the parallel lights are incident on the light guide plate. The light guide plate has such a size that the diagonal line is 32 inches long, and width×height is W:700 mm×H:400 mm, and the lights are incident thereon through the W:700 mm side.

The bar laser diode used as the laser light source is configured such that 33 emitters each having a stripe width of 60 μm are aligned in the width of 10 mm, and a pitch between two adjacent emitters is 300 μm. An angle (full width at half maximum) at which a light from each emitter is spread is about 10 degrees in the direction of the stripe width, and about 40 degrees in the direction perpendicular to the stripe width. The collimator lens of the laser light source is preferably a high NA lens from the viewpoint of acquisition efficiency. On the other hand, a long focus lens is preferable for reducing an angle of view so as to collimate lights from the emitters which are aligned over the length of 10 mm. The long focus lens of a high NA inevitably has an increased size. However, 2 sets of cylindrical lenses are used so as to satisfy the above-mentioned condition in order to avoid the increase in size of an apparatus. That is, a short focus cylindrical lens (FAC lens) having a high NA is used for the direction of the spread angle of 40 degrees while a long focus cylindrical lens (SAC lens) having a low NA is used for the direction of the spread angle of 10 degrees. The double-sided lenticular lens is disposed at a position of an exit pupil of the SAC lens such that a beam is spread in the direction of width of 10 mm of the bar laser diode. In this configuration, it is possible to realize an optical system which includes a light source enabling enhancement of an anisotropy, and is suited for a high output bar laser diode. The lights emitted from the double-sided lenticular lens are caused to be almost parallel lights by the cylindrical Fresnel lens immediately before the lights enter the light guide plate. This is because the polarization planes of the lasers are equally oriented.

<Designing of Double-Sided Lenticular Lens>

When a test production of a double-sided lenticular lens is performed through acrylic molding, a maximum NA value of the lens is calculated as about 0.5 since acryl satisfies a refractive index n=1.49@640 nm. The radius of curvature of the double-sided lenticular lens is calculated by using the following expression [3], where f represents a focal length, l represents an interval between two sides, r represents a radius of curvature, and n represent a refractive index.

$$f = l = r^* n/(n-1) \quad [3]$$

Figure 8:
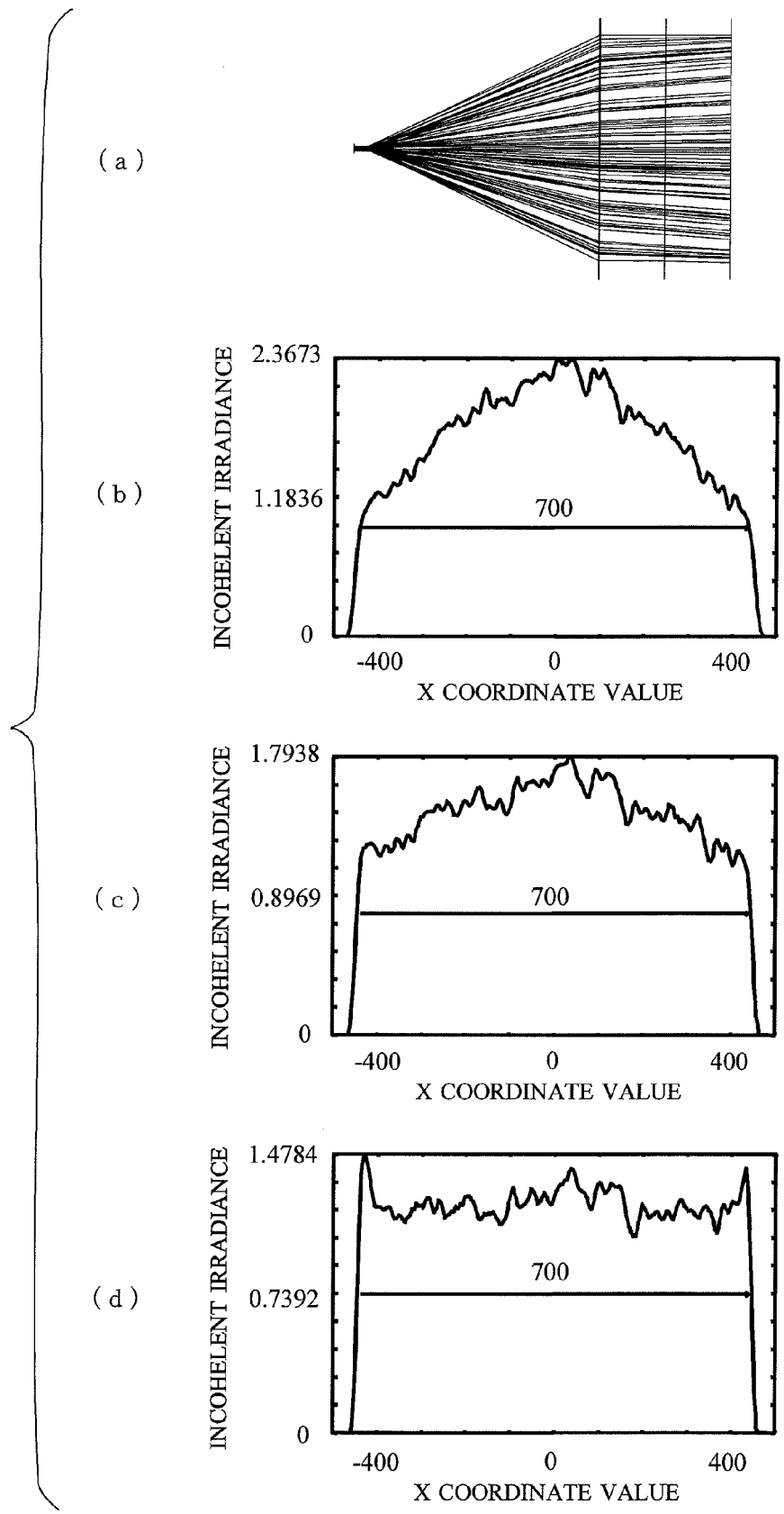
FIG. 8 is a diagram illustrating an exemplary specific designing of the planar illumination apparatus.

From the viewpoint of the uniformity in the light amount distribution and an amount of light which is incident within 700 mm, a desired NA value is about 0.4, and therefore a distribution of an amount of a light passing through the light guide plate is adjusted by means of a cylindrical Fresnel lens provided immediately preceding the light guide plate. FIG. 8 shows a whole light path (a) in the designed line diffuser optical system, and a light amount distribution on an incidence plane (b), a center portion (c), and a final-portion plane (d) of the light guide plate. On the incidence plane (b) of the light guide plate, the light amount distribution is not uniform. However, the light amount becomes uniform as the light proceeds, and the distribution is almost uniform on the final-portion plane (d). This is because used is an optical disposition in which the spherical aberration of the cylindrical Fresnel lens is used to diffuse paraxial lights and weakly converge off-axis lights. The specifications of the optical elements used in a simulation is as follows.

double-sided lenticular lens: NA 0.39, EFL 1.22
cylindrical Fresnel lens: size 720*25*t3, EFL 1200
A usability of the line diffuser will be described below.
The polarization is more easily maintained than a fiber-use type.
Uniformity in light amount distribution is obtained, with enhanced ease, by using an aspherical lens, a diffraction element, and the like.
Speckle noises may be cancelled, with enhanced ease, by, for example, shifting a luminous point and driving an optical element because luminous points are localized.
A cost for components remains almost unchanged even when a screen size is increased, because no optical fiber is used.
Mechanical lifetime is increased as compared to a polygon mirror scanning type because no driving mechanism is used.
Lights are collected in a manner different from that used for the polygon mirror scanning type, so that the thickness can be easily reduced.

As described above, the planar illumination apparatus according to the first embodiment of the present invention uses a laser light having a high color purity and a high light emitting efficiency, thereby realizing an enhanced color reproducibility, uniformity in brightness, and reduced power consumption.

In FIG. 1, the second cylindrical lens 7 may be disposed between the first cylindrical lens 6 and the one-dimensional diffuser 5, or between the one-dimensional diffuser 5 and the light source 30. In this configuration, the second cylindrical lens 7 may be disposed in a space in which the width of the laser light is narrow, thereby reducing the size of the second cylindrical lens 7.

Second Embodiment

In the first embodiment as described above, the size of the light guide plate 9 is small, and the light source 30 which can emit necessary amount of lights has a size small enough to be mounted on the main surface of the light guide plate 9. However, in a case where the light guide plate 9, such as a light guide plate for use in, for example, a large screen liquid crystal TV, has an increased size, the size of the light source 30 which can emit the necessary amount of lights is increased, so that the light source 30 may not be mounted on the main surface of the light guide plate 9.

In a second embodiment, the planar illumination apparatus in which the light source 30 is not mounted on the main surface of the light guide plate 9 will be described.

Figure 9:
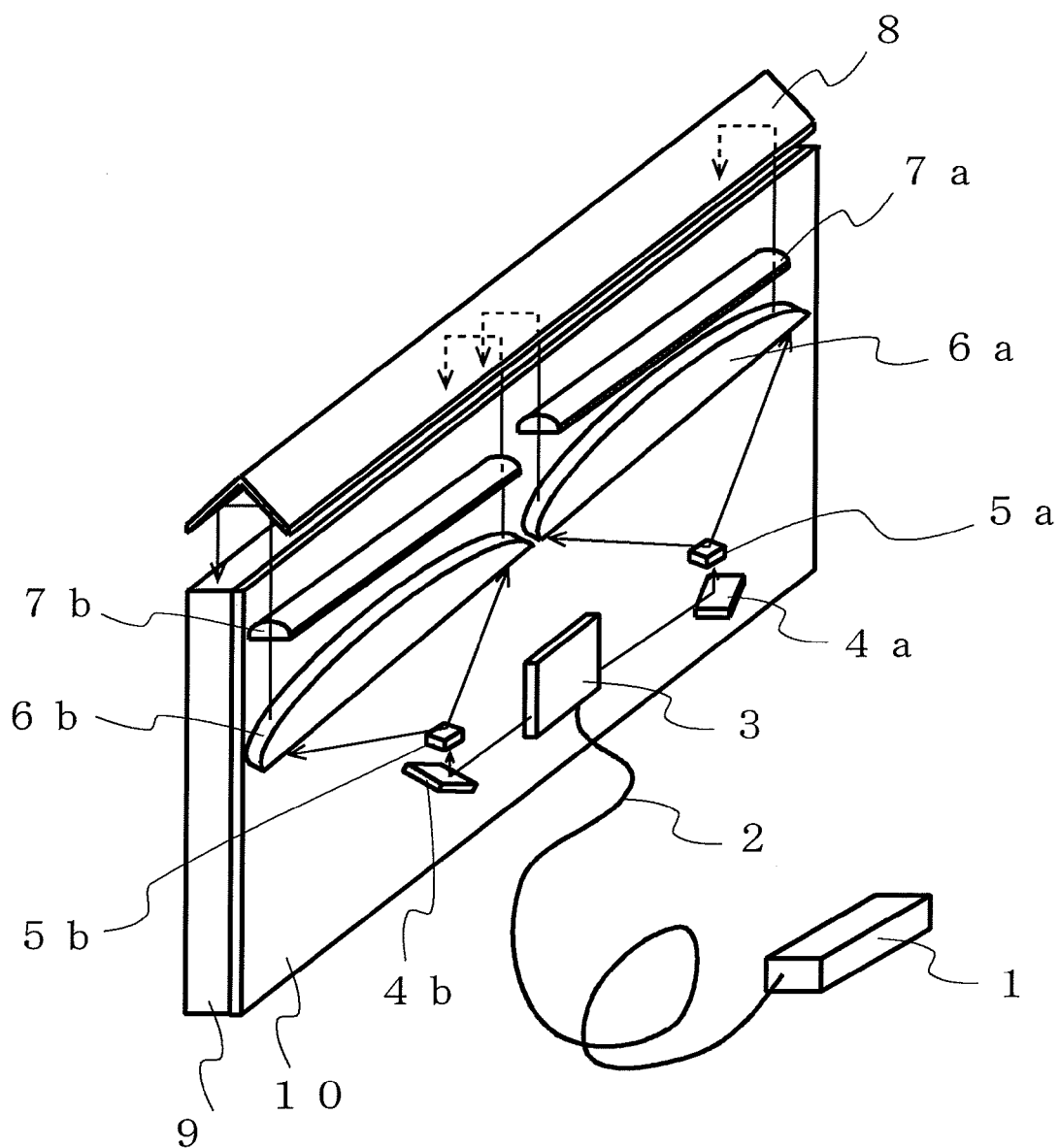
FIG. 9 is a perspective view illustrating a configuration of a planer illumination apparatus according to a second embodiment of the present invention.

FIG. 9 is a perspective view illustrating a configuration of a planar illumination apparatus according to the second embodiment of the present invention. The planar illumination apparatus, as shown in FIG. 9, according to the second embodiment includes a light source 1, an optical fiber 2, a polarization separation section 3, a mirror 4a and a mirror 4b, a one-dimensional diffuser 5a and a one-dimensional diffuser 5b, a first cylindrical lens 6a and a first cylindrical lens 6b, a second cylindrical lens 7a and a second cylindrical lens 7b, the mirror 8, the light guide plate 9, and the reflector plate 10.

The reflector plate 10 is bonded to one of the main surfaces of the light guide plate 9. The light source 1 and the polarization separation section 3 are connected to each other through the optical fiber 2. The polarization separation section 3, the mirrors 4a and 4b, the one-dimensional diffusers 5a and 5b, the first cylindrical lenses 6a and 6b, and the second cylindrical lenses 7a and 7b are mounted on the reflector plate 10. Laser lights emitted from the light source 1 are separated in two directions by the polarization separation section 3. The laser lights in one direction pass through the mirror 4a, the one-dimensional diffuser 5a, the first cylindrical lens 6a, and the second cylindrical lens 7a, and the courses of the laser lights are changed 180 degrees by means of the mirror 8, so as to guide the laser lights to the light guide plate 9, while the laser lights in the other direction pass through the mirror 4b, the one-dimensional diffuser 5b, the first cylindrical lens 6b, and the second cylindrical lens 7b, and the courses of the laser lights are changed 180 degrees by means of the mirror 8, so as to guide the laser lights to the light guide plate 9.

Hereinafter, the respective components of the planar illumination apparatus according to the second embodiment will be sequentially described.

Figure 10:
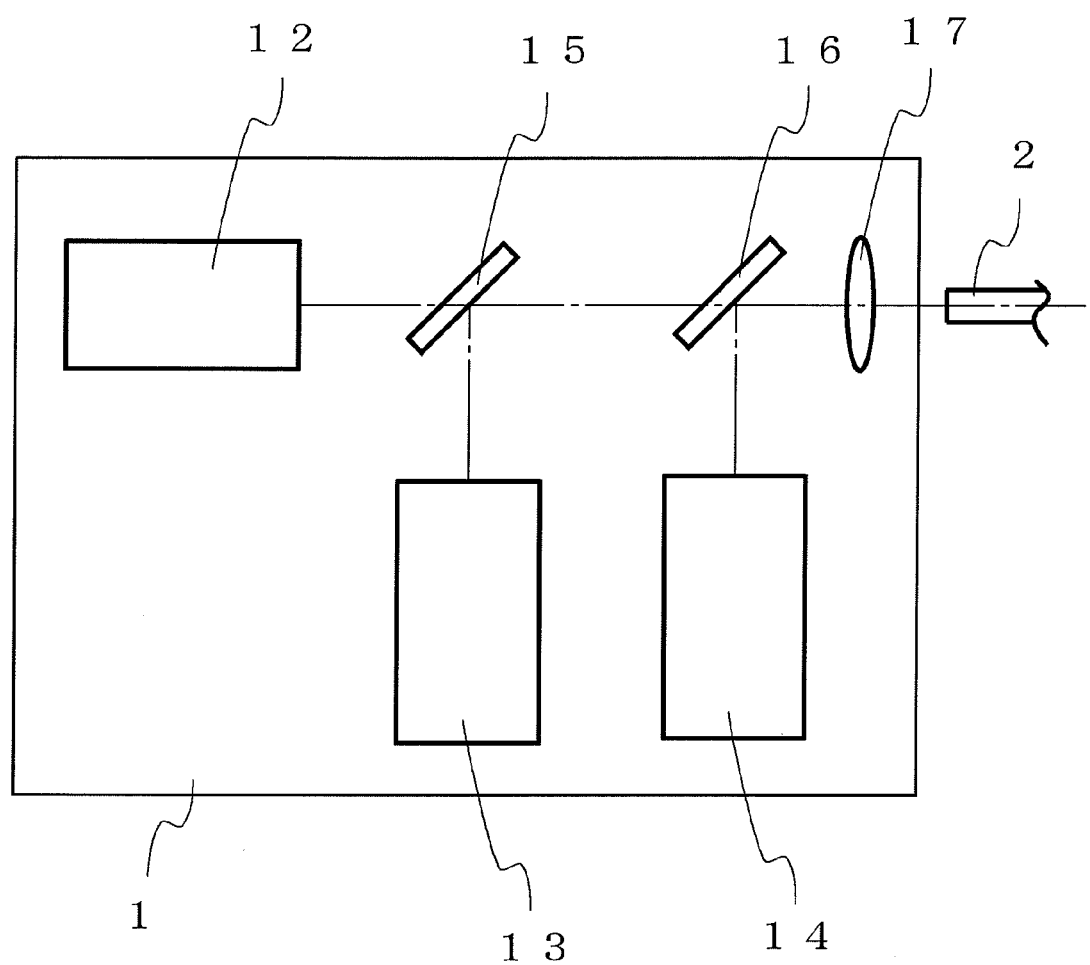
FIG. 10 is a diagram illustrating an exemplary configuration of a light source 1.

The light source 1 is a laser light source for emitting laser lights of three primary colors, and has a configuration as shown in FIG. 10, for example. As shown in FIG. 10, the light source 1 includes a blue laser light source 12, a red laser light source 13, a green laser light source 14, a dichroic mirror 15, a dichroic mirror 16, and a lens 17. The dichroic mirror 15 passes a blue light therethrough, and reflects a red light. The dichroic mirror 16 passes a blue light and a red light therethrough, and reflects a green light. A blue laser light emitted from the blue laser light source 12 passes through the dichroic mirrors 15 and 16, and is then collected by the lens 17 and guided to the optical fiber 2. A red laser light emitted from the red laser light source 13 is reflected by the dichroic mirror 15, and passes through the dichroic mirror 16, and is then collected by the lens 17 and guided to the optical fiber 2. A green laser light emitted from the green laser light source 14 is reflected by the dichroic mirror 16, and is then collected by the lens 17 and guided to the optical fiber 2. The laser lights of the respective colors, which have been guided to the optical fiber 2, are transmitted to the polarization separation section 3.

Figure 11:
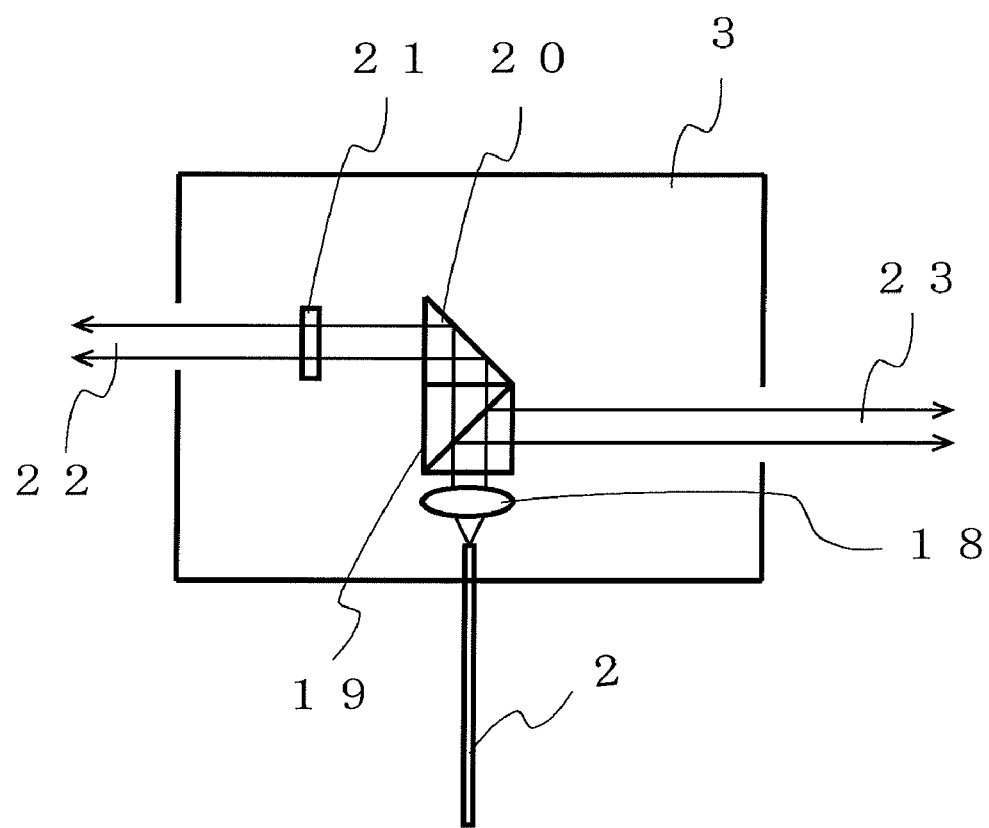
FIG. 11 is a diagram illustrating an exemplary configuration of a polarization separation section 3.

The polarization separation section 3 functions to equally orient the polarization planes of the laser lights which are randomly oriented while the laser lights pass through the optical fiber 2. FIG. 11 is a diagram illustrating in detail an exemplary configuration of the polarization separation section 3. The polarization separation section 3 shown in FIG. 11 includes a lens 18, a polarization beam splitter 19, a prism 20, and a half wavelength plate 21.

The laser lights of the respective colors, which are emitted from the optical fiber 2, are applied to the lens 18, and are converted to parallel lights. The polarization beam splitter 19 separates the laser lights which are the parallel lights obtained through the conversion performed by the lens 18, into a P polarized light component and an S polarized light component. The S polarized light is reflected and becomes a laser light 23 (a first output light). The P polarized light passes through the polarization beam splitter 19, and is then reflected by the prism 20, and becomes a laser light 22 (a second output light). The laser light 22 has its polarization plane rotated by the half wavelength plate 21, and becomes an S polarized light, that is, both the laser light 22 and the laser light 23 become the S polarized lights, respectively. Therefore, the laser lights having the equally oriented polarization planes are emitted in the two directions by the polarization separation section 3.

When the half wavelength plate 21 is provided in the light path of the laser light 23 shown in FIG. 11, the polarization plane of the laser light 23 can be oriented such that the polarization plane of the laser light 23 and the polarization plane (P polarized light) of the laser light 22 are equally oriented. Further, in the above description, the half wavelength plate 21 is a half wavelength plate, for a wide band, which approximately halves the wavelengths of the red light, the green light, and the blue light. However, the laser light emitted from the prism 20 may be separated for each color such that the separated laser lights pass through light paths, respectively, depending on the color, and an optimal half wavelength plate may be used for each color.

The laser lights which have the equally oriented polarization planes are emitted from the polarization separation section 3 in the two directions, and are reflected by the mirrors 4a and 4b so as to be incident on the one-dimensional diffusers 5a and 5b, respectively.

The one-dimensional diffusers 5a and 5b, which are each configured as a hologram or a lens array, diffuse the laser lights emitted from the mirrors 4a and 4b, respectively, at an angle θ' in the one-dimensional direction. The one-dimensional diffusers 5a and 5b each have the same configuration as the one-dimensional diffuser 5 described in the first embodiment, and the planes for diffusing the laser lights are designed so as to be parallel to the main surface of the light guide plate 9. The angle θ' at which each of the one-dimensional diffusers 5a and 5b diffuse the laser lights is basically ½ of the angle θ at which the one-dimensional diffuser 5 diffuses the laser light.

The first cylindrical lenses 6a and 6b convert, to parallel lights, the laser lights which have the equally oriented polarization planes and are diffused by the one-dimensional diffusers 5a and 5b, respectively, at the angle θ'. The second cylindrical lenses 7a and 7b converge the laser lights which are the parallel lights obtained through the conversions performed by the first cylindrical lenses 6a and 6b, respectively, in the direction of the thickness of the light guide plate 9. The mirror 8 is a reflector plate having an L-shaped cross section, and reflects the laser lights having been converged in the direction of the thickness of the light guide plate 9 by the second cylindrical lenses 7a and 7b, respectively, 90 degrees twice, and emits the reflected laser lights to the light guide plate 9. While the laser lights incident on the light guide plate 9 are repeatedly subjected to multiple reflection or repeatedly diffused in the light guide plate 9, and proceed, the laser lights are emitted from the main surface of the light guide plate 9.

The first cylindrical lenses 6a and 6b, the second cylindrical lenses 7a and 7b, the mirror 8, and the light guide plate 9 basically have the same functions as the first cylindrical lens 6, the second cylindrical lens 7, the mirror 8, and the light guide plate 9, respectively, as described in the first embodiment.

As described above, in the planar illumination apparatus according to the second embodiment of the presents invention, even when the optical fiber 2 is used due to the light source 1 being unable to be mounted on the main surface of the light guide plate 9, the polarization planes of the laser lights are equally oriented by the polarization separation section 3. Thus, the laser light having a high color purity and a high light emitting efficiency is used to realize an enhanced color reproducibility, uniformity in brightness, and reduced power consumption In FIG. 9, the second cylindrical lenses 7a and 7b may be disposed between the first cylindrical lenses 6a and 6b and the one-dimensional diffusers 5a and 5b, respectively, or between the one-dimensional diffusers 5a and 5b, respectively, and the polarization separation section 3. In this configuration, the second cylindrical lenses 7a and 7b may be disposed in a space in which the width of the laser light is narrow, thereby reducing the sizes of the second cylindrical lenses 7a and 7b.

Third Embodiment

Figure 12:
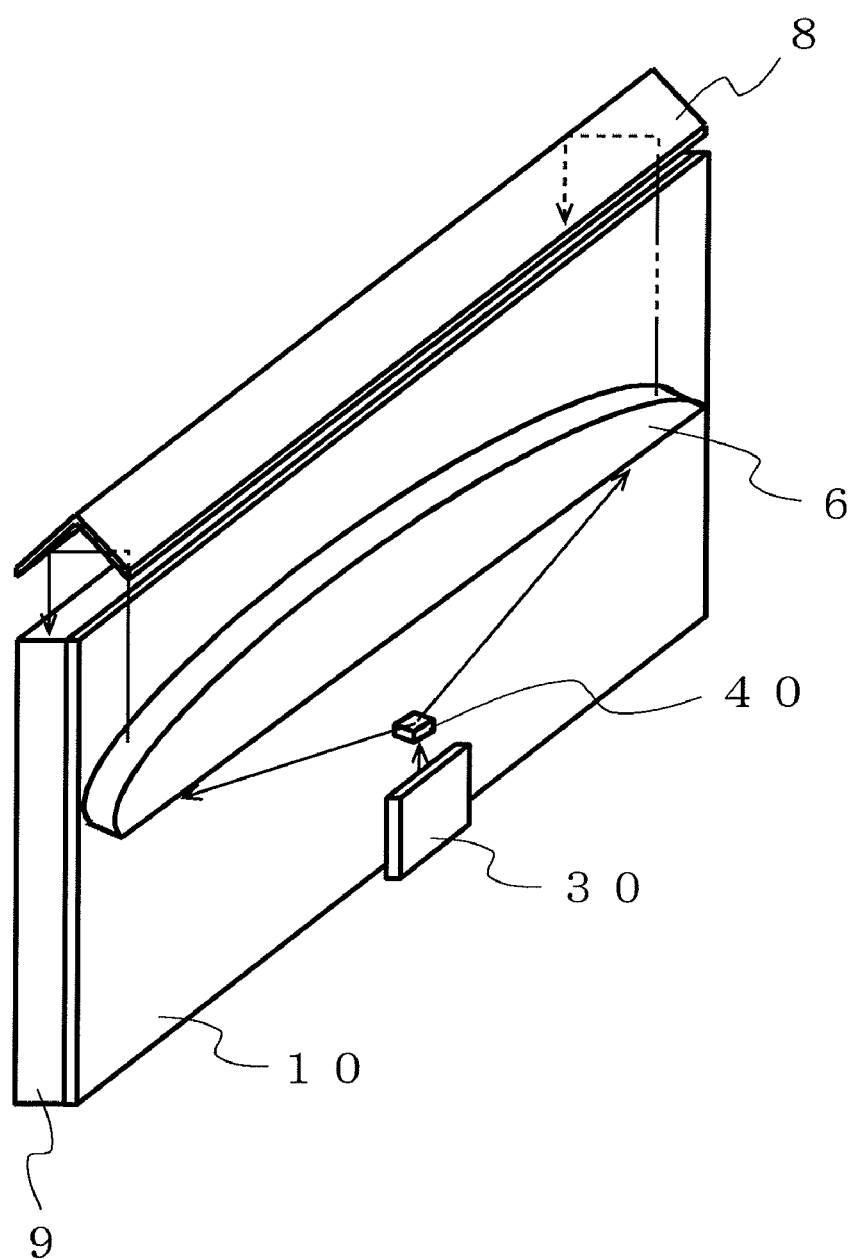
FIG. 12 is a perspective view illustrating a configuration of a planer illumination apparatus according to a third embodiment of the present invention.

FIG. 12 is a perspective view illustrating a configuration of a planar illumination apparatus according to a third embodiment of the present invention. The planar illumination apparatus, as shown in FIG. 12, according to the third embodiment includes the light source 30, a one-dimensional diffuser 40, the cylindrical lens 6, the mirror 8, the light guide plate 9, and the reflector plate 10.

The planar illumination apparatus according to the third embodiment is different from the planar illumination apparatus according to the first embodiment in that, in the planar illumination apparatus according to the third embodiment, the one-dimensional diffuser 40 is used instead of the one-dimensional diffuser 5, and the second cylindrical lens 7 is not used. The configuration of the planar illumination apparatus according to the third embodiment is the same as the configuration of the planar illumination apparatus according to the first embodiment except for the one-dimensional diffuser 40. Therefore, the description of the components other than the one-dimensional diffuser 40 is not given.

Figure 13:
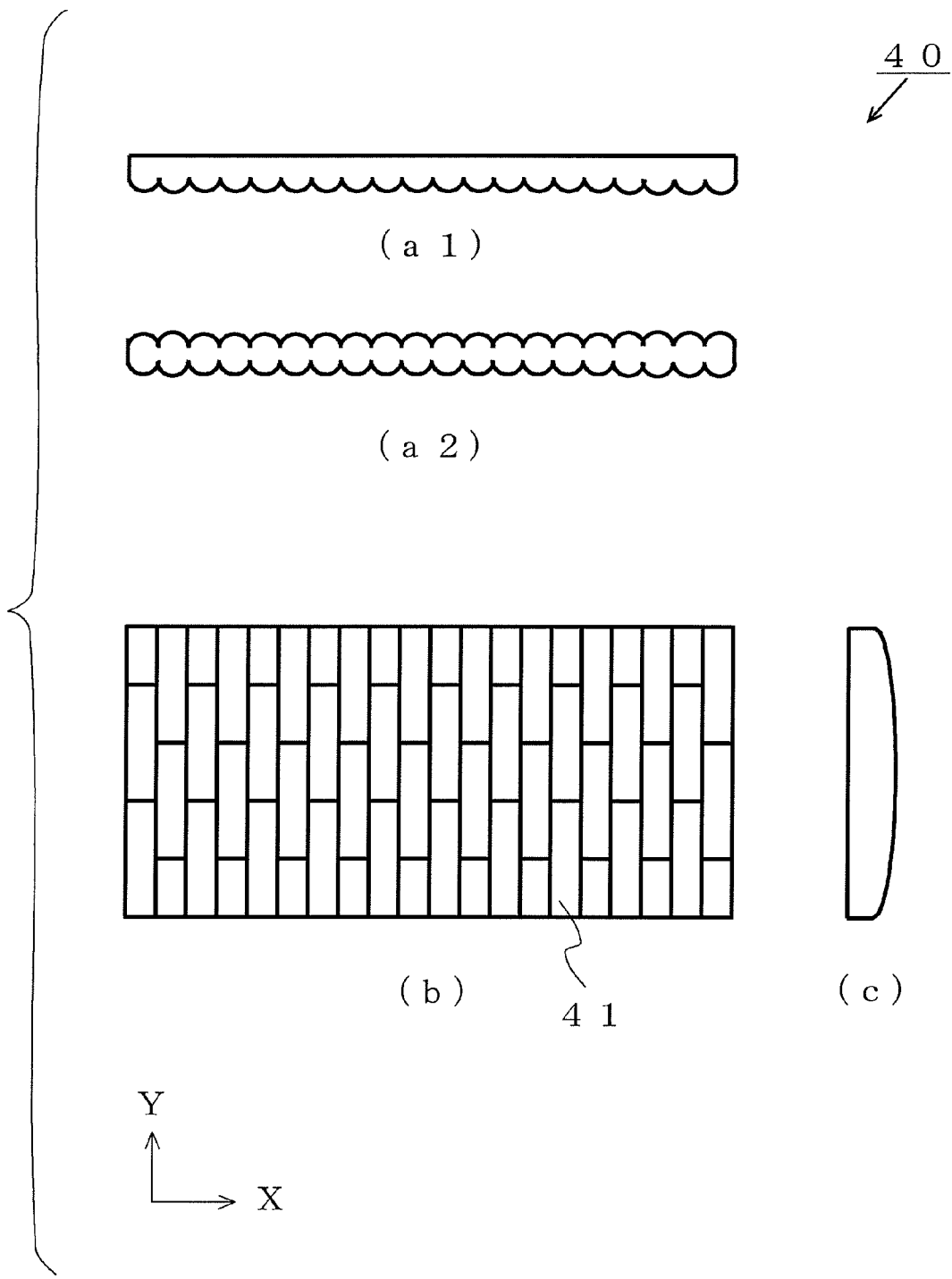
FIG. 13 is a diagram illustrating an exemplary configuration of a one-dimensional diffuser 40.

FIG. 13 includes top views (a1) and (a2), an elevation view (b), and a side view (c) illustrating an exemplary configuration of the one-dimensional diffuser 40. The one-dimensional diffuser 40 shown in FIG. 13 is configured such that a plurality of cylindrical lenses 41 each having a curved surface are aligned on one surface (a1) or both surfaces (a2) in the X direction shown in the drawing so as to form an array, and further a cylindrical surface having a surface curved in the Y direction shown in the drawing is formed over one surface of the one-dimensional diffuser 40.

As described above, in the planar illumination apparatus according to the third embodiment of the present invention, the one-dimensional diffuser 40 is capable of converting the laser lights emitted from the light source 30 such that lights are diffused in the one-dimensional direction parallel to the light guide plate 9, and the lights are converged in the direction orthogonal to the diffusing direction. Therefore, even when the second cylindrical lens 7 is eliminated, the laser lights can be efficiently incident on the light guide plate 9.

Fourth Embodiment

Figure 14:
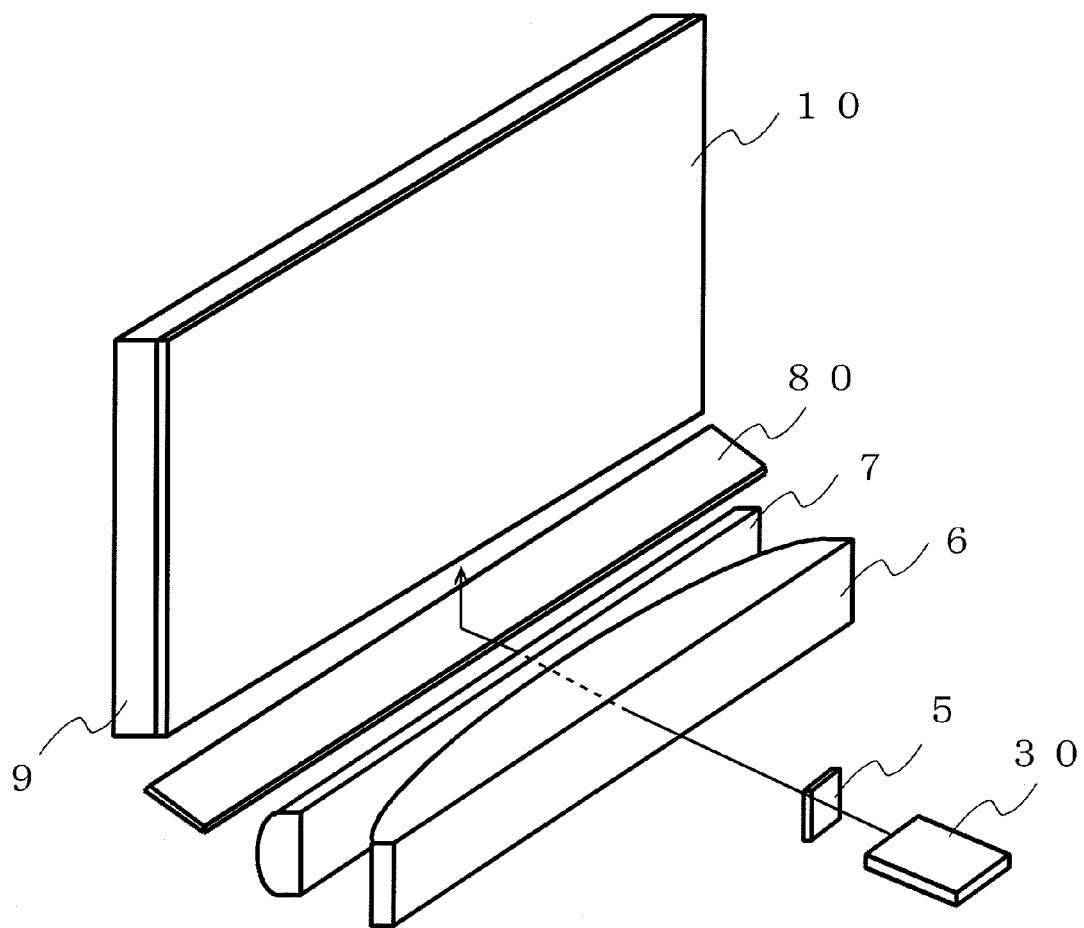
FIG. 14 is a perspective view illustrating a configuration of a planer illumination apparatus according to a fourth embodiment of the present invention.

FIG. 14 is a perspective view illustrating a configuration of a planar illumination apparatus according to a fourth embodiment of the present invention. The planar illumination apparatus, shown in FIG. 14, according to the fourth embodiment includes the light source 30, the one-dimensional diffuser 5, the first cylindrical lens 6, the second cylindrical lens 7, a mirror 80, the light guide plate 9, and the reflector plate 10.

In the fourth embodiment, described is an exemplary configuration in which the light source 30, the one-dimensional diffuser 5, the first cylindrical lens 6, and the second cylindrical lens 7 are not mounted on the main surface of the light guide plate 9.

As indicated in an example shown in FIG. 14, when the respective components described above are not mounted on the main surface of the light guide plate 9, the mirror 80, having a flat plate shape, for transmitting the laser lights emitted from the second cylindrical lens 7 so as to make the laser lights incident on the side surface of the light guide plate 9 may be disposed so as to be tilted at an appropriate angle.

Fifth Embodiment

Figure 15:
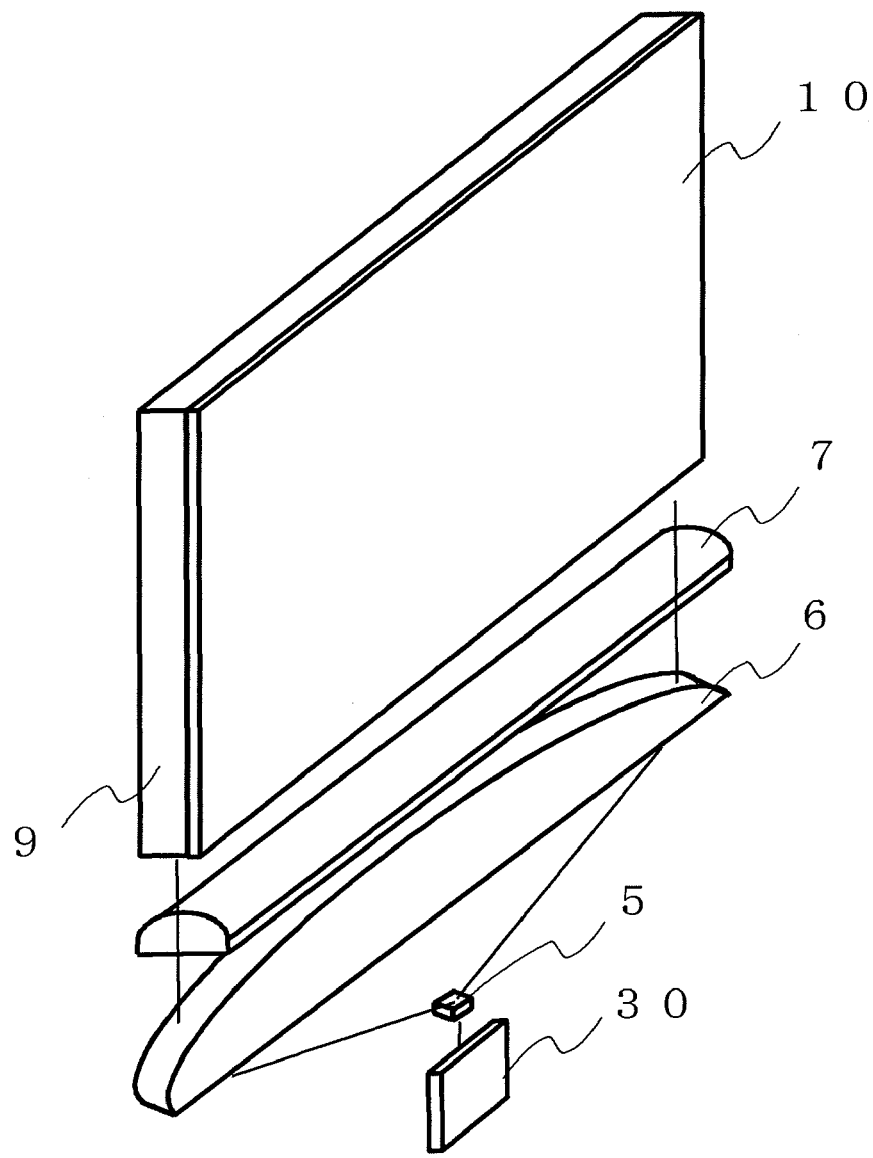
FIG. 15 is a perspective view illustrating a configuration of a planer illumination apparatus according to a fifth embodiment of the present invention.

FIG. 15 is a perspective view illustrating a configuration of a planar illumination apparatus according to a fifth embodiment of the present invention. The planar illumination apparatus, shown in FIG. 15, according to the fifth embodiment includes the light source 30, the one-dimensional diffuser 5, the first cylindrical lens 6, the second cylindrical lens 7, the light guide plate 9, and the reflector plate 10.

In the fifth embodiment, described is an exemplary configuration in which the light source 30, the one-dimensional diffuser 5, the first cylindrical lens 6, and the second cylindrical lens 7 are not mounted on the main surface of the light guide plate 9 while the respective components are disposed parallel to the main surface of the light guide plate 9.

When the respective components are disposed parallel to the main surface of the light guide plate 9 outside the light guide plate 9 as indicated in an example shown in FIG. 15, laser lights may be emitted from the second cylindrical lens 7 so as to be directly incident on the side surface of the light guide plate 9 without using the mirror 80.

The configuration (first embodiment) in which laser lights are directly emitted from the light source to the one-dimensional diffuser is applied to the third to the fifth embodiments. However, it should be understood that the configuration (second embodiment) in which laser lights are transmitted through the optical fiber from the light source to the one-dimensional diffuser may be applied thereto.

(Example of Liquid Crystal Display Apparatus Using the Planar Illumination Apparatus)

Figure 16:
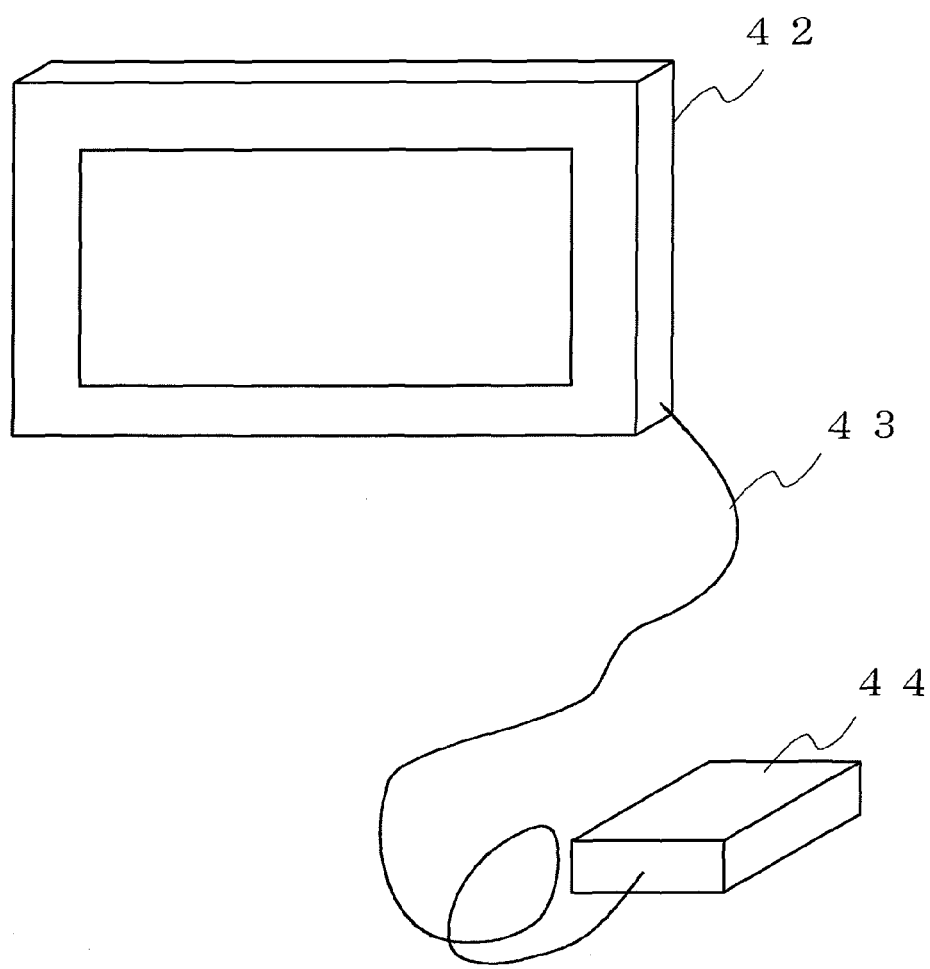
FIG. 16 is a diagram illustrating an example of a liquid crystal display apparatus using the planar illumination apparatus.
Figure 17:
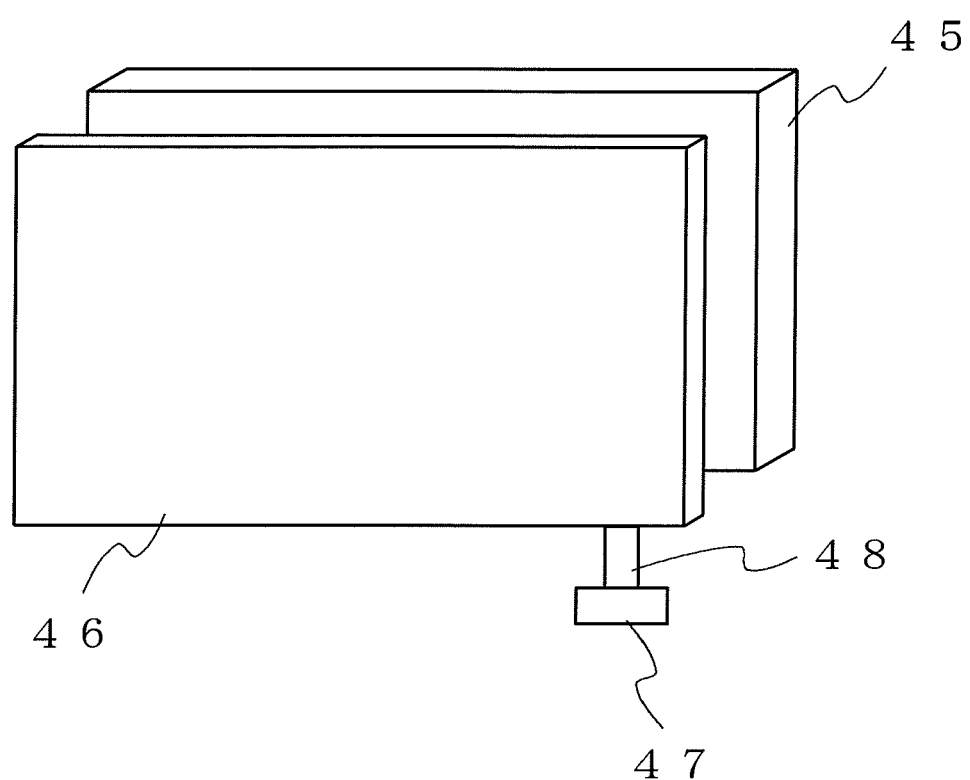
FIG. 17 is a diagram illustrating in detail an exemplary configuration of a monitor section 42.

FIG. 16 is a diagram illustrating an exemplary configuration of a liquid crystal display apparatus. The liquid crystal display apparatus is configured such that a monitor section 42 and a control box 44 are connected to each other through a connection cable 43. FIG. 17 is a diagram illustrating in detail an exemplary configuration of the monitor section 42 shown in FIG. 16. The monitor section 42 includes the planar illumination apparatus 45 according to the second embodiment, a liquid crystal panel 46, and an image display circuit 47.

The image display circuit 47 is connected to the liquid crystal panel 46 through a wiring 48, and drives the liquid crystal panel 46 so as to display an image. The control box 44 includes at least a power supply and a light source, and supplies power and light to the monitor section 42 through the connection cable 43. The light supplied from the control box illuminates the liquid crystal panel 46 by using the planar illumination apparatus 45, and the image display circuit 47 drives the liquid crystal panel 46, thereby displaying an image. At this time, when the orientation of the polarization plane of the light emitted from the planar illumination apparatus 45 is the same as the orientation of a polarizer on the incidence plane of the liquid crystal panel 46, the liquid crystal display apparatus having an enhanced light utilization efficiency may be realized.

INDUSTRIAL APPLICABILITY

The planar illumination apparatus according to the present invention is applicable to a liquid crystal display apparatus and the like, and is, in particular, useful when it is desired that enhanced color reproducibility, uniformity in brightness, and reduced power consumption be realized while maintaining a reduced thickness and an increased area size.

The invention claimed is:

1. A planar illumination apparatus using a laser light, comprising:
   a laser light source operable to emit laser lights having equally oriented polarization planes;
   a one-dimensional diffuser operable to diffuse the laser lights emitted from the laser light source at an angle θ in a one-dimensional direction;
   a cylindrical lens section operable to convert, to parallel lights, the laser lights diffused by the one-dimensional diffuser; and
   a light guide plate, having a rectangular parallelepiped shape having two main surfaces and four side surfaces, operable to receive the laser lights which are the parallel lights obtained through conversion performed by the cylindrical lens section, on one of the four side surfaces such that the one-dimensional direction is parallel to the two main surfaces, and operable to emit the laser lights from one of the two main surfaces.

2. The planar illumination apparatus according to claim 1, wherein the cylindrical lens section further converges the laser lights diffused by the one-dimensional diffuser, in a direction of a thickness of the light guide plate.

3. The planar illumination apparatus according to claim 1, wherein the one-dimensional diffuser further converges the laser lights emitted from the laser light source, in a direction orthogonal to the one-dimensional direction in which the laser lights are diffused.

4. The planar illumination apparatus according to claim 1, further comprising a mirror operable to reflect the laser lights emitted from the cylindrical lens section so as to make the laser lights incident on one of the four side surfaces of the light guide plate.

5. The planar illumination apparatus according to claim 4, wherein the laser light source, the one-dimensional diffuser, and the cylindrical lens section are mounted on the other of the two main surfaces, the other of the two main surfaces being opposed to the one of the two main surfaces.

6. The planar illumination apparatus according to claim 1, wherein when each of the two main surfaces of the light guide plate has such a size as to satisfy a long side W and a short side H, and the laser lights emitted from the cylindrical lens section are incident on a side surface contacting the long side W among the four side surfaces, the angle θ at which the one-dimensional diffuser diffuses the laser lights is calculated by using an expression:

$$\theta > \tan^{-1}(W/2H) \times 2.$$

7. The planar illumination apparatus according to claim 1, wherein when each of the two main surfaces of the light guide plate has such a size as to satisfy a long side W and a short side H, and the laser lights emitted from the cylindrical lens section are incident on a side surface contacting the short side H among the four side surfaces, the angle θ at which the one-dimensional diffuser diffuses the laser lights is calculated by using an expression:

$$\theta > \tan^{-1}(H/2W) \times 2.$$

8. The planar illumination apparatus according to claim 1, wherein the one-dimensional diffuser is a micro cylindrical lens array.

9. The planar illumination apparatus according to claim 1, further comprising a vibration section operable to slightly vibrate the one-dimensional diffuser.

10. The planar illumination apparatus according to claim 9, wherein a vibration frequency used by the vibration section is a frequency other than an audio frequency.

11. The planar illumination apparatus according to claim 9, wherein a vibration amplitude used by the vibration section is set to an interval between two adjacent bright points of a speckle noise.

12. The planar illumination apparatus according to claim 1, wherein the equally oriented polarization planes of the laser lights emitted from the laser light source are parallel or perpendicular to the two main surfaces of the light guide plate.

13. The planar illumination apparatus according to claim 1, wherein the laser light source is a multi-emitter semiconductor laser, and a plane on which a plurality of emitters of the multi-emitter semiconductor laser are mounted is optically parallel to the two main surfaces of the light guide plate.

14. The planar illumination apparatus according to claim 1, wherein the laser light source includes a plurality of light sources operable to emit laser lights having wavelengths, respectively, different from each other, and the laser lights, having a plurality of the wavelengths, which are emitted from the plurality of light sources, respectively, are incident on the one-dimensional diffuser so as to have an overall width which is smaller than or equal to a thickness of the light guide plate.

15. The planar illumination apparatus according to claim 1, wherein the laser light source includes:
   a plurality of light sources operable to emit a plurality of laser lights having wavelengths, respectively, different from each other;
   an optical fiber operable to transmit the plurality of laser lights emitted from the plurality of light sources, respectively; and
   a polarization separation section operable to equally orient polarization planes of the plurality of laser lights emitted from the optical fiber.

16. The planar illumination apparatus according to claim 15, wherein the polarization separation section separates the plurality of laser lights into P polarized lights and S polarized lights, and outputs, as first output lights, one of the P polarized lights and the S polarized lights, and orients polarization planes of the other thereof such that polarization planes of the first output lights and the polarization planes of the other thereof are equally oriented, and thereafter outputs, as second output lights, the other thereof.

17. The planar illumination apparatus according to claim 15, wherein the cylindrical lens section further converges the laser lights diffused by the one-dimensional diffuser, in the direction of the thickness of the light guide plate.

18. The planar illumination apparatus according to claim 15, wherein the one-dimensional diffuser further converges the laser lights emitted from the laser light source, in the direction orthogonal to the one-dimensional direction in which the laser lights are diffused.

19. The planar illumination apparatus according to claim 15, further comprising a mirror operable to reflect the laser lights emitted from the cylindrical lens section so as to make the laser lights incident on one of the four side surfaces of the light guide plate.

20. The planar illumination apparatus according to claim 19, wherein the polarization separation section, the one-dimensional diffuser, and the cylindrical lens section are mounted on the other of the two main surfaces, the other of the two main surfaces being opposed to the one of the two main surfaces.

21. The planar illumination apparatus according to claim 15, wherein the one-dimensional diffuser is a micro cylindrical lens array.

22. The planar illumination apparatus according to claim 15, further comprising a vibration section operable to slightly vibrate the one-dimensional diffuser.

23. The planar illumination apparatus according to claim 22, wherein a vibration frequency used by the vibration section is a frequency other than an audio frequency.

24. A liquid crystal display apparatus comprising:
   the planar illumination apparatus according to claim 1;
   a liquid crystal panel illuminated by the laser lights emitted from the planar illumination apparatus; and
   an image display circuit operable to drive the liquid crystal panel.

25. A liquid crystal display apparatus comprising:
   the planar illumination apparatus according to claim 15;
   a liquid crystal panel illuminated by the laser lights emitted from the planar illumination apparatus; and
   an image display circuit operable to drive the liquid crystal panel.

* * * * *